(12) United States Patent
Asao et al.

(10) Patent No.: US 12,207,414 B2
(45) Date of Patent: Jan. 21, 2025

(54) TAPE FEEDER

(71) Applicant: FUJI CORPORATION, Chiryu (JP)

(72) Inventors: Hidekazu Asao, Minami Aso-mura (JP); Akira Hara, Toyohashi (JP)

(73) Assignee: FUJI CORPORATION, Chiryu (JP)

(*) Notice: Subject to any disclaimer, the term of this patent is extended or adjusted under 35 U.S.C. 154(b) by 1358 days.

(21) Appl. No.: 16/644,735

(22) PCT Filed: Sep. 25, 2017

(86) PCT No.: PCT/JP2017/034578
§ 371 (c)(1),
(2) Date: Mar. 5, 2020

(87) PCT Pub. No.: WO2019/058562
PCT Pub. Date: Mar. 28, 2019

(65) Prior Publication Data
US 2020/0267879 A1    Aug. 20, 2020

(51) Int. Cl.
*H05K 13/08*    (2006.01)
*B65H 20/20*    (2006.01)
*H05K 13/04*    (2006.01)

(52) U.S. Cl.
CPC ......... *H05K 13/0419* (2018.08); *B65H 20/20* (2013.01); *H05K 13/082* (2018.08); *H05K 13/089* (2018.08)

(58) Field of Classification Search
CPC ........... H05K 13/0419; H05K 13/0417; H05K 13/0015; H05K 13/020434; H05K 13/043;
(Continued)

(56) References Cited

U.S. PATENT DOCUMENTS

| 6,902,090 | B2* | 6/2005 | Yamamura | H05K 13/0419 226/32 |
| 6,905,013 | B2* | 6/2005 | Liebeke | H05K 13/0419 198/832.1 |

(Continued)

FOREIGN PATENT DOCUMENTS

| JP | 2001-127489 A | 5/2001 |
| JP | 2005-228970 A | 8/2005 |
| JP | 2011-82500 A | 4/2011 |

OTHER PUBLICATIONS

International Search Report issued Oct. 24, 2017 in PCT/JP2017/034578 filed Sep. 25, 2017, citing documents AA and AO-AQ therein, 2 pages.

*Primary Examiner* — Michael R Mansen
*Assistant Examiner* — Katelynne R Burrell
(74) *Attorney, Agent, or Firm* — Oblon, McClelland, Maier & Neustadt, L.L.P.

(57) ABSTRACT

A tape feeder including: an angle sensor configured to detect a final angle of the sprocket at a point in time at which interruption of power supply to the tape feeder is detected, and a current angle of the sprocket at a point in time at which resumption of power supply to the tape feeder is detected; and a control device configured to, when resumption of power supply to the tape feeder is detected, set a target angle of the sprocket based on the final angle, and perform control to rotate the sprocket from the current angle to the target angle so as to convey the carrier tape to a predetermined position.

9 Claims, 5 Drawing Sheets

(58) Field of Classification Search
CPC ............... H05K 13/082; H05K 13/083; H05K 13/086; H05K 13/087; H05K 13/089; H05K 13/0882; B65H 20/20; B65H 20/22; G01B 7/30

See application file for complete search history.

(56) References Cited

U.S. PATENT DOCUMENTS

| | | | | |
|---|---|---|---|---|
| 7,036,702 | B2* | 5/2006 | Liebeke | H05K 13/0419 |
| | | | | 226/139 |
| 7,073,696 | B2* | 7/2006 | College | H05K 13/0419 |
| | | | | 226/188 |
| 7,506,434 | B2* | 3/2009 | Sumi | H05K 13/0417 |
| | | | | 226/137 |
| 8,157,142 | B2* | 4/2012 | Tsukagoshi | H05K 13/0812 |
| | | | | 226/76 |
| 8,414,244 | B2* | 4/2013 | Fritschy | H05K 13/0419 |
| | | | | 414/416.06 |
| 2003/0226873 | A1* | 12/2003 | Liebeke | H05K 13/0419 |
| | | | | 226/76 |
| 2005/0096781 | A1* | 5/2005 | Sumida | H05K 9/0016 |
| | | | | 700/213 |
| 2005/0224183 | A1 | 10/2005 | Oyama et al. | |
| 2008/0047652 | A1* | 2/2008 | Gutentag | H05K 13/0084 |
| | | | | 156/64 |
| 2010/0242267 | A1* | 9/2010 | Tsukagoshi | H05K 13/0417 |
| | | | | 226/49 |
| 2016/0212897 | A1* | 7/2016 | Tsuge | H05K 13/089 |

* cited by examiner

ΔA = (final angle) − (current angle)

TAPE FEEDER

TECHNICAL FIELD

The present disclosure relates to a tape feeder.

BACKGROUND ART

A tape feeder is used for a mounting process by an electronic component mounting machine, as disclosed in, for example, patent literature 1. The tape feeder conveys carrier tape containing electronic components by rotating a sprocket that engages the carrier tape to provide an electronic component to the electronic component mounting machine at a supply section. The tape feeder is loaded with carrier tape during setup prior to being set in the electronic component mounting machine.

However, when the sprocket is rotated for some reason in an off state in which power to the tape feeder is cut after the setup, the carrier tape is shifted from the loaded position. Then, if the tape feeder set in the electronic component mounting machine tries to supply the electronic component, there is a possibility that a supply error occurs in which the electronic component is not normally supplied to the supply section. In view of this, in patent literature 1, the sprocket is rotated using a worm gear, thereby restricting the sprocket from rotating when the tape feeder is in an off state.

CITATION LIST

Patent Literature

Patent Literature 1: 4PJAJ2011J0-2800

BRIEF SUMMARY

Technical Problem

However, when a worm gear is used to rotate the sprocket, the worm gear is accommodated in the case, which may restrict the widthJdirection miniaturization. Further, it is desirable for a tape feeder to suppress the occurrence of supply errors of electronic components in an on state even if the sprocket rotates to some extent in an off state, while allowing widthJdirection miniaturization.

It is an object of the present specification to provide a tape feeder capable of suppressing the occurrence of supply errors of electronic components in an on state even if the sprocket rotates to some extent in an off state.

Solution to Problem

Disclosed herein is a tape feeder configured to convey carrier tape containing electronic components and supply an electronic component to an electronic component mounting machine, the tape feeder including: a feeder main body; a sprocket rotatably provided on the feeder main body and arranged with multiple engagement protrusions configured to engage with multiple engagement holes formed on the carrier tape; an angle sensor configured to detect a final angle of the sprocket at a point in time at which interruption of power supply to the tape feeder is detected, and a current angle of the sprocket at a point in time at which resumption of power supply to the tape feeder is detected; and a control device configured to, when resumption of power supply to the tape feeder is detected, set a target angle of the sprocket based on the final angle, and perform control to rotate the sprocket from the current angle to the target angle so as to convey the carrier tape to a predetermined position.

Advantageous Effects

According to such a configuration, when the tape feeder shifts from the off state to the on state, the sprocket is rotated to a target angle corresponding to the final angle. As a result, even if the sprocket rotates to some extent in the off state, the deviation amount is absorbed by the sprocket being rotated to the target angle. Thus, the tape feeder can reliably provide electronic components to the supply section. As a result, the tape feeder can suppress the occurrence of electronic component supply errors while in the on state while allowing the sprocket to rotate to some extent in the off state.

BRIEF DESCRIPTION OF DRAWINGS

FIG. 8 is a flowchart showing normal processing with the tape feeder in an on state.

DESCRIPTION OF EMBODIMENTS

1. Embodiments

1J1. Overview of Electronic Component Mounting Machine 10

Figure 1:
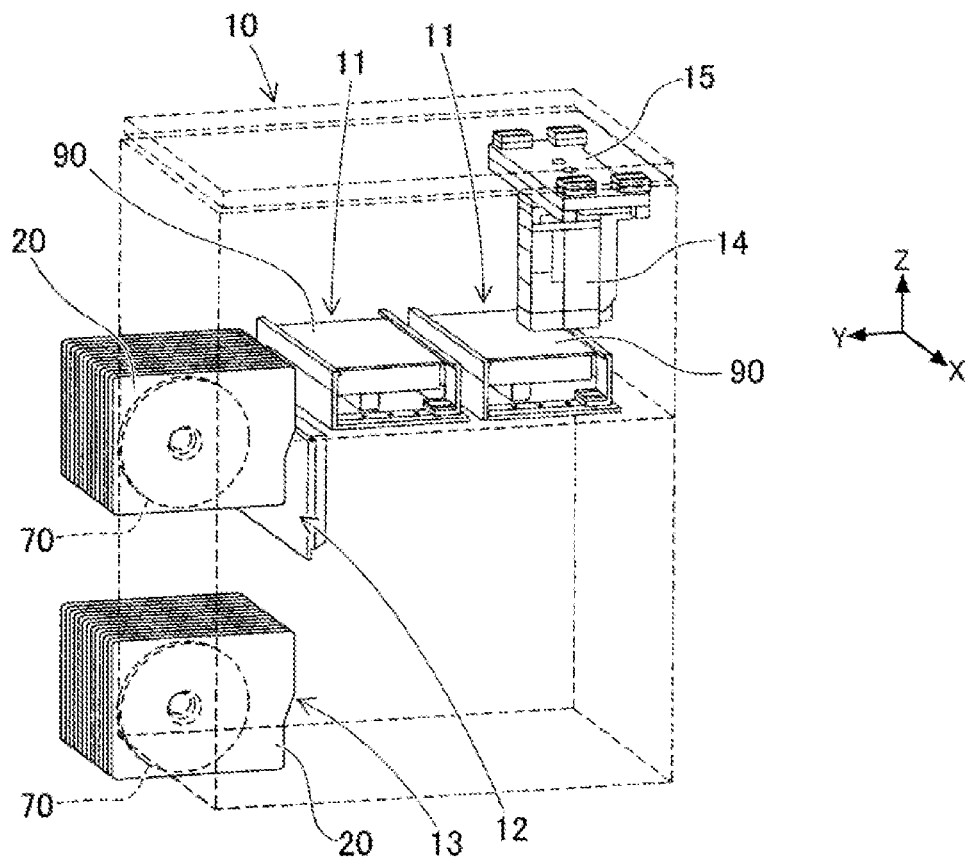
FIG. 1 is a perspective view showing an overview of the configuration of an electronic component mounting machine.

Electronic component mounting machine 10 uses tape feeder 20 to mount electronic components on circuit board 90. Hereinafter, the electronic component mounting machine is referred to as "component mounter", the tape feeder is referred to as "feeder", the circuit board is referred to as "board", and the electronic component is referred to as "component". As shown in FIG. 1, component mounting machine 10 includes board conveyance device 11, upper section slots 12, lower section slots 13, mounting head 15, and head moving device 18. Board conveyance device 11 loads board 90 inside component mounting machine 10, and positions the board 90 at a predetermined position. Then, after mounting processing has been performed by component mounting machine 10, board conveyance device 11 unloads circuit board 90 from component mounting machine 10.

Upper section slots 12 are arranged on an upper section on the front side of component mounting machine 10. Upper section slots 12 hold feeders 20 in a manner such that operation is possible. Operation of feeders 20 set in upper section slots 12 during mounting processing is controlled by component mounting machine 10, such that components are supplied to supply section 211 provided at a specified position on an upper section of feeders 20 (refer to FIG. 2).

Lower section slots 13 are provided below upper section slots 12. Lower section slots 13 store feeders 20 to be used in mounting processing by component mounting machine 10 or used feeders 20 that have been used in mounting processing. Note that, exchange of feeders 20 between upper section slots 12 and lower section slots 13 is performed automatically by an exchange robot (not shown), or manually by an operator.

Mounting head 15 is provided with a suction nozzle (not shown) that picks up a component supplied by feeder 20. The suction nozzle is supplied with negative pressure air to pick up the component. Instead of a suction nozzle, mounting head 15 may be provided with a chuck or the like for gripping a component in order to pick up and hold it. Mounting head 15 holds the suction nozzle so as to be vertically movable and rotatable about a vertical axis. Head moving device 18 moves mounting head 15 in a horizontal direction via, for example, a linear drive mechanism.

Component mounting machine 10 configured as described above appropriately controls operation of mounting head 15, head moving device 18, and feeders 20 during mounting processing. As a result, component mounting machine 10 picks up components supplied by feeders 20, and mounts the components at predetermined positions of board 90 to produce various board products.

1J2. Configuration of Feeder 20

Figure 2:
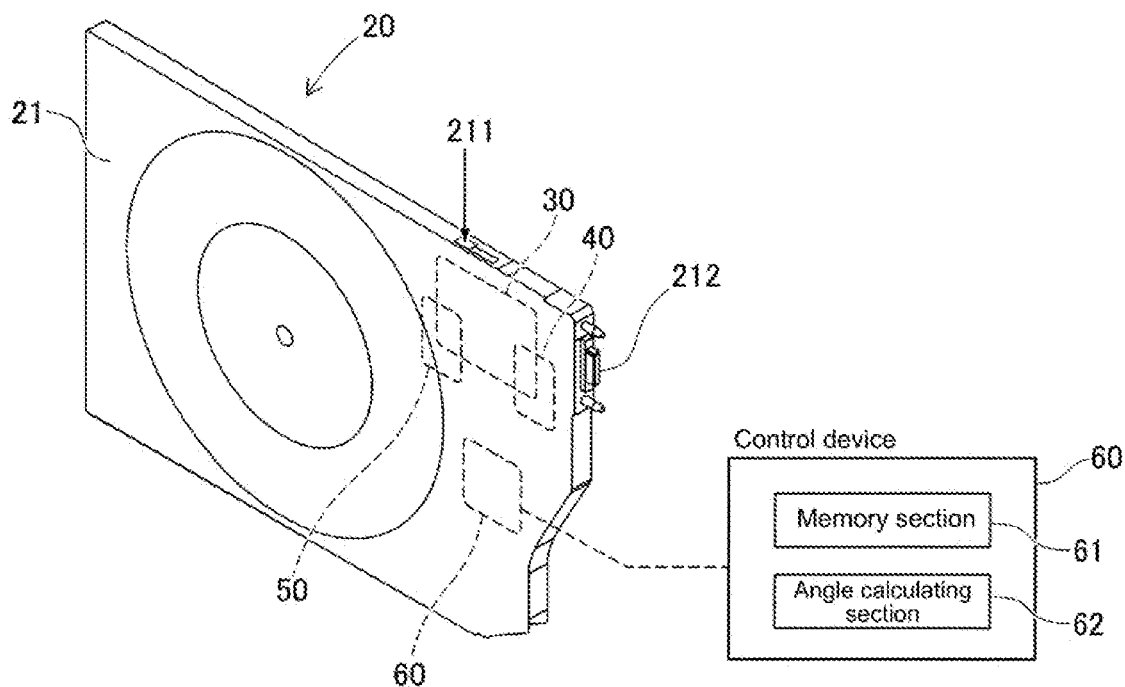
FIG. 2 is a perspective view of a tape feeder.

The configuration of feeder 20 will be described with reference to FIGS. 2 to 5. Feeder 20 includes feeder main body 21, driving device 30, angle sensor 50, detection sensor 80, and control device 60. As shown in FIG. 2, feeder main body 21 is formed in a flat box shape. Feeder main body 21 has supply section 211 for supplying components to component mounting machine 10. Supply section 211 is formed on an upper section on the front side of feeder main body 21 (lower right side in FIG. 2).

Figure 3:
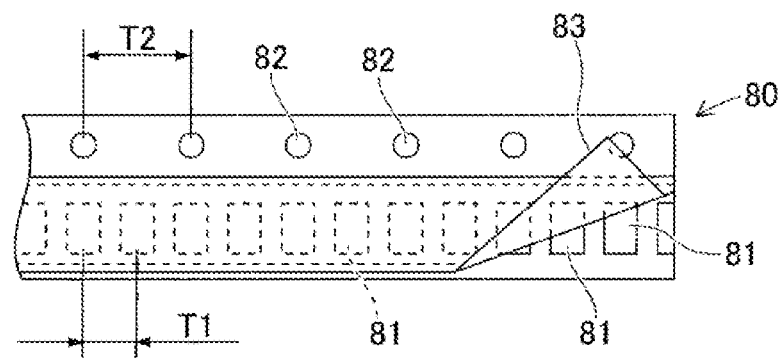
FIG. 3 is a plan view showing a portion of carrier tape.
Figure 4:
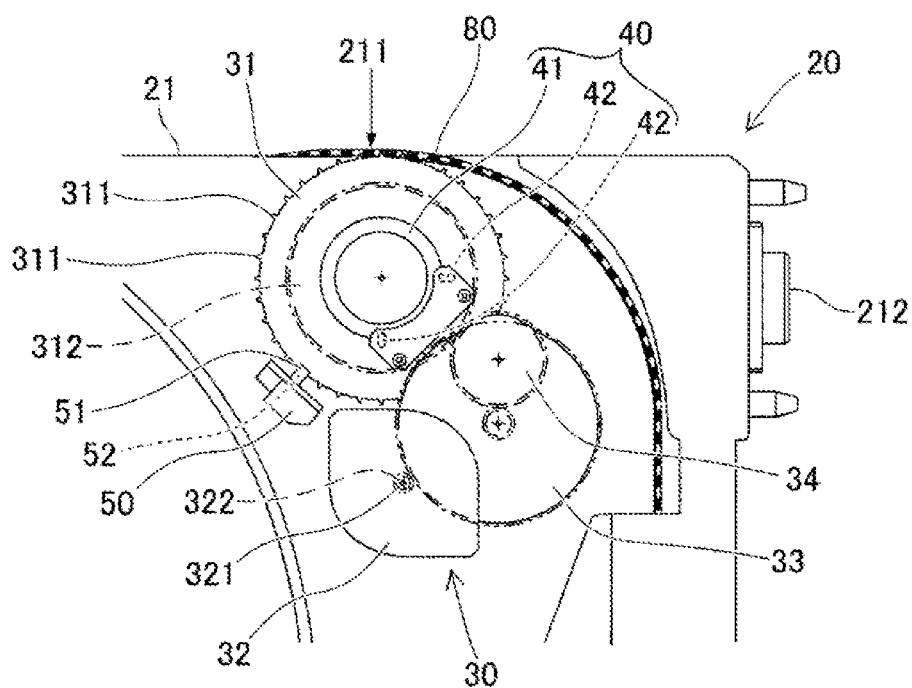

In addition, feeder main body 21 detachably (exchangeably) holds tape reel 70 on which carrier tape -0 is wound. Tape reel 70 is rotatably supported with respect to feeder main body 21. As shown in FIG. 3, carrier tape -0 has multiple cavities -1 for accommodating components, and multiple engagement holes -2 formed at predetermined intervals in the conveyance direction (longitudinal direction of the carrier tape).

Cover tape -3 is bonded to the upper surface of carrier tape -0 such that the opening section of cavities -1 is closed. Cover tape -3 is peeled from a portion of carrier tape -0 conveyed to supply section 211 such that mounting head 15 can pick up a component. In other words, by positioning one of the multiple cavities -1 in carrier tape -0 at supply section 211, the feeder 20 supplies the component housed in the cavity -1 such that pickup is possible. Hereinafter, carrier tape is referred to as "tape".

Here, multiple cavities -1 are formed at predetermined intervals in the conveyance direction, similar to the multiple engagement holes -2. Interval T1 of cavities -1 is set appropriately according to the dimensions of the components being housed. For example, as shown in FIG. 3, interval T1 of cavities -1 is set to half the interval T2 of engagement holes -2 (T1=T2/2). Further, interval T1 of cavities -1 may be set to an integer multiple of spacing T2 of engagement holes -2 (T1=N–T2, N being an integer greater than or equal to 1).

Figure 5:
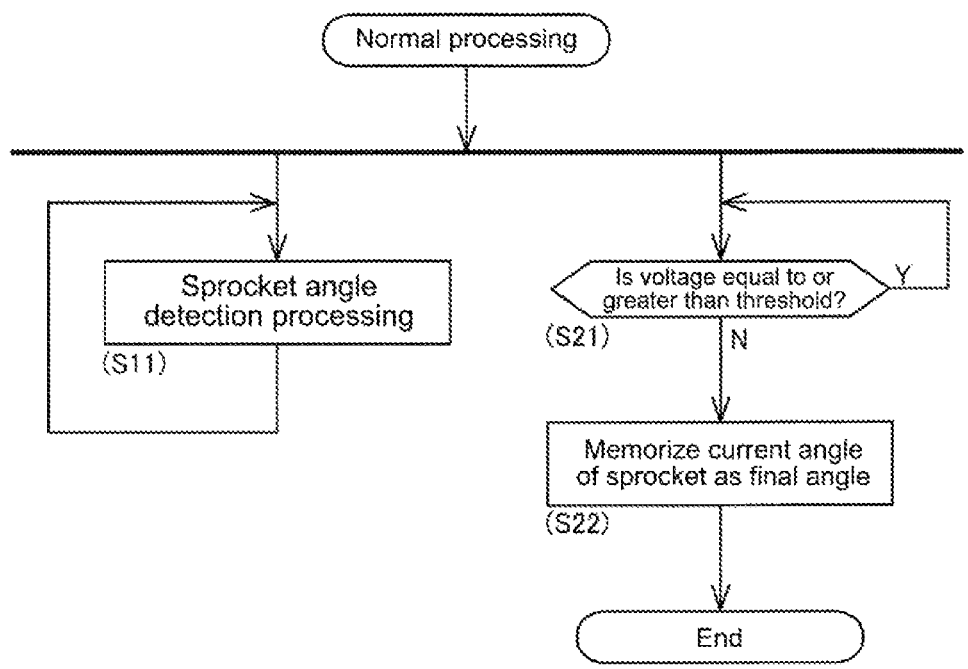
FIG. 5 is a side view schematically showing the configuration of the tape feeder.

As shown in FIG. 5, driving device 30 has sprocket 31 rotatably supported by feeder main body 21. Sprocket 31 has engagement protrusions 311 that can engage with engagement holes -2 of tape -0 arranged at equal intervals in a circumferential direction. Driving device 30 has stepping motor 32 as a drive source for turning sprocket 31. Stepping motor 32 rotates sprocket 31 in accordance with supplied pulse power.

Specifically, when rotation shaft 321 of stepping motor 32 rotates, reduction gear 33 engaging with driving gear 322 provided on rotation shaft 321 rotates. The driving force outputted by stepping motor 32 is transmitted to sprocket 31 via intermediate gear 35 engaging with reduction gear 33. Intermediate gear 35 engages with sprocket gear 312 provided on sprocket 31. As a result, sprocket 31 rotates as intermediate gear 35 rotates.

Note that, with driving device 30 according to the present embodiment, spur gears are applied to the respective gears constituting the transmission path of the driving force from stepping motor 32, which is the drive source, to sprocket 31 which is the driving object. According to such a configuration, while the load applied to sprocket 31 can be transmitted to stepping motor 32, the widthJdirection dimension of driving device 30 as a whole can be reduced, and feeder 20 can be formed to be flatter, which is advantageous. By flattening feeder 20, it is possible to increase the number of feeders 20 that can be arranged in the conveyance direction of board 90 in the production line, and therefore it is possible to improve productivity per area.

Angle sensor 50 detects the angle of sprocket 31 with respect to feeder main body 21. In an embodiment above, angle sensor 50 is configured from magnetic body 51 and pair of magnetic sensors 52. Magnetic body 51 is provided so as to rotate in conjunction with the rotation of sprocket 31. In the present embodiment, magnetic body 51 is formed in a cylindrical shape, and is provided coaxially with sprocket 31 so as to rotate integrally with sprocket 31. Magnetic body 51 is magnetized so as to be radially bipolar.

Each of the pair of magnetic sensors 52 outputs a detection signal corresponding to the angle of magnetic body 51 with respect to feeder main body 21. Specifically, the magnitude and direction of the magnetic field generated by magnetic body 51 are detected, and sinusoidal detection signals are outputted. The pair of magnetic sensors 52 are arranged at specified angles (90 degrees in this embodiment) apart from each other along the rotational direction of magnetic body 51. As a result, detection signals outputted from the pair of magnetic sensors 52 are shifted in phase by 90 degrees.

Further, angle sensor 50 calculates the angle of sprocket 31 provided with magnetic member 51 based on the detection signals respectively outputted by the pair of magnetic sensors 52. More specifically, angle sensor 50 detects the angle of sprocket 31 over the entire circumference in accordance with the resolution of the sensor. As a result, control device 60 is configured to be able to recognize the angles of all the engagement protrusions 311 arranged on the outer periphery of sprocket 31.

Detection sensor 80 detects one of multiple engagement protrusions 311 of sprocket 31. In the present embodiment, detection sensor 80 includes light emitter 81 and light receiver 82. As shown in FIG. 5, light emitter 81 and light receiver 82 are disposed at diametrical positions of sprocket 31 on which engagement protrusion 311 is formed so as to oppose each other so as to sandwich the engagement protrusion 311. Detection sensor 80 receives the light emitted from light emitter 81 via light receiver 82. When switching to a state in which light is blocked from entering light receiver 82, detection sensor 80 recognizes that one of the multiple protrusions 311 is positioned between light emitter 81 and light receiver 82.

Control device 60 performs control to rotate sprocket 31 to convey tape -0 to a predetermined position. When feeder 20 is set in an upper section slot 12 of component mounting machine 10, electric power is supplied from component mounting machine 10 via connector 212. As a result, control device 60 can communicate with component mounting machine 10. Control device 60 controls operation of driving device 30 based on a control command or the like by component mounting machine 10.

Specifically, while mounting processing is being performed by component mounting machine 10, control device 60 supplies pulse power to stepping motor 32 of driving device 30, and performs control to position the multiple cavities -1 of tape -0 sequentially at supply section 211. As tape -0 is pitchJfed by the operation of driving device 30, cover tape -3 is peeled off before supply section 211. In this manner, feeder 20 supplies components to supply section 211 for pickup at component mounting machine 10.

As shown in FIG. 2, control device 60 includes memory section 61 and angle adjusting section 62. Memory section 61 is composed of a nonJvolatile flash memory or the like. Various programs and calibration values used for controlling operation of driving device 30 are stored in memory section 61. Angle adjusting section 62 adjusts the angle of sprocket 31 when resumption of the power supply to feeder 20 is detected. Details of sprocket 31 angle adjusting processing by angle adjusting section 62 will be described in detail later.

1J3. Normal Processing of Feeder 20

Normal processing of feeder 20 will be described referring to FIGS. 3, 8, and 6. Here, it is assumed that feeder 20 loaded with tape -0 is set on an upper section slot 12 of component mounting machine 10. Control device 60 performs normal processing as shown in FIG. 8 in a state in which power is being supplied to feeder 20 (hereinafter, referred to as "on state"). Specifically, control device 60 detects angle of the sprocket 31 by the angle sensor 50 (step 11 [hereinafter, step is referred to as "S" ]).

Control device 60 corrects the pulsed power supplied to stepping motor 32 using a calibration value corresponding to the detected current angle of sprocket 31. As a result, feeder 20 rotates sprocket 31 to sequentially position the multiple cavities -1 at supply section 211. Here, in tape -0 loaded in feeder 20, as shown in FIG. 3, it is assumed that interval T1 of cavities -1 is set to half interval T2 of engagement holes -2.

Further, control device 60 monitors the power supplied to feeder 20 in parallel with detection processing (S11) of detecting the angle of sprocket 31. More specifically, when the voltage at a specified location in the power supply circuit of feeder 20 is maintained at or above a threshold value (S21: yes), control device 60 recognizes that feeder 20 is on. Control device 60 repeats the above determination (S21), for example, on a predetermined cycle.

When the voltage at the aboveJmentioned location of the power supply circuit is lower than the predetermined voltage (S21: no), control device 60 recognizes that the power supply to the feeder 20 has been interrupted by, for example, feeder 20 being detached from upper section slot 12 such that the power supply to the feeder 20 was interrupted (hereinafter referred to as "off state"). In other words, as described above, control device 60 detects the interruption of the power supply to the feeder 20 by the fact that the voltage at a specified location in the power supply circuit is less than a threshold value.

Next, control device 60 stores current angle of sprocket 31 last detected by angle sensor 50 as final angle in memory section 61 using electric power accumulated in the power supply circuit (S22), then ends normal processing. With feeder 20, when the electric power accumulated in the power supply circuit has been discharged, driving device 30, control device 60, the various sensors, and the like are stopped.

Figure 6:
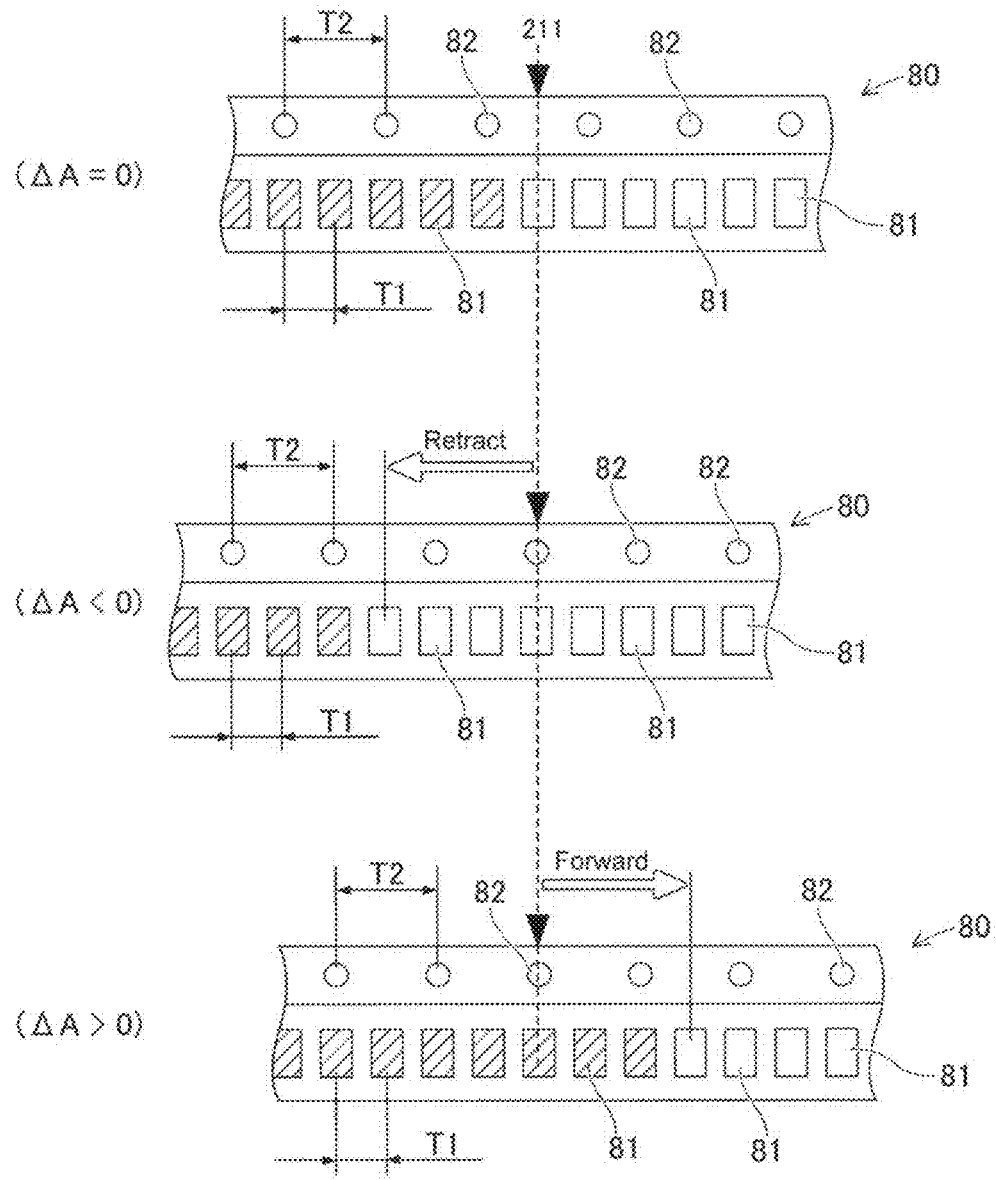
FIG. 6 illustrates states of carrier tape when the sprocket is rotated with the feeder in the off state.

Here, as shown in the upper part of FIG. 6, feeder 20 is in a condition in which the cavity -1 at which a component has been collected is positioned at supply section 211. FIG. 6 shows cavities -1 containing a component with shading and empty cavities -1 without shading.

Here, as shown in the upper part of FIG. 6, the position of tape -0, which is positioned at supply section 211, at which cavity -1 one to the leading end side of tape -0 from the first cavity -1 in tape -0 from the leading end side (the right side in FIG. 6) that houses a component is defined as the standby position. Feeder 20, when operating, positions tape -0 at the standby position, and in a case in which there is a component supply request from component mounting machine 10, supplies a component by pitch feeding tape -0 by interval T1 between cavities -1.

Then, when the component has been picked up from the cavity -1 positioned at supply section 211, tape -0 is returned to the condition shown in the upper part of FIG. 6.

Note that, feeder 20 is set in a setup jig (not shown) that is outside of component mounting machine 10, and loaded with a specified tape -0. Here, feeder 20 is put into an on state by the setup jig, and rotates sprocket 31 in response to operations by an operator so as to bring tape -0 to the standby position. As a result, the feeder 20 is loaded with the tape -0 in the setup, and removed with the tape -0 at the standby position.

Further, feeder 20 performs the aboveJmentioned normal processing in the on state set in the setup jig. Therefore, when the feeder 20 is removed from the setup jig and transitions to the off state, the current angle of sprocket 31 last detected by angle sensor 50 in the setup is stored in memory section 61 as the final angle in the same manner as when feeder 20 is removed from upper section slot 12 of component mounting machine 10.

1J5. Adjusting Processing for Adjusting the Angle of Sprocket 31

Angle adjusting section 62 of control device 60 adjusts the angle of sprocket 31 based on the final angle when it detects resumption of supplying power to feeder 20, that is, when it detects a transition of feeder 20 from the off state to the on state. Here, when feeder 20 is turned off after being set up as described above and then sprocket 31 is rotated for some reason, tape -0 is shifted from loaded standby position in which it was loaded.

Specifically, as shown in the middle of FIG. 6, tape -0 may shift backwards in the lengthwise direction of the tape. Further, as shown in the lower part of FIG. 6, tape -0 may shift forwards in the lengthwise direction of the tape. The middle and lower parts of FIG. 6 show states in which a deviation amount of about three times the gap T1 between cavities -1 has occurred from the standby position of the tape -0 (see the upper part of FIG. 6).

In other words, if the interval T2 of engagement holes -2 of tape -0 loaded in feeder 20 is half the interval T1 of cavities -1 (T2=T1/2), sprocket 31 is rotated in the off state by about 1.8 times the angle formed by adjacent engagement protrusions 311. If, for example, a feeder 20 in a state where such a shift of tape -0 has occurred is set on component mounting machine 10, the feeder 20 rotates sprocket 31 to try to position the cavity -1 at supply section 211 as if the tape -0 is in the standby position.

In this case, the cavity -1 is not properly positioned at supply section 211, and there is a possibility that a supply error occurs in which a component is not supplied. Such a supply error may cause a decrease in productivity of component mounting machine 10 or unnecessary wasting of components. Thus, in the present embodiment, when feeder 20 transitions to the on state, adjusting processing for adjusting sprocket 31 to an appropriate angle is performed to prevent the occurrence of a supply error.

Figure 7:
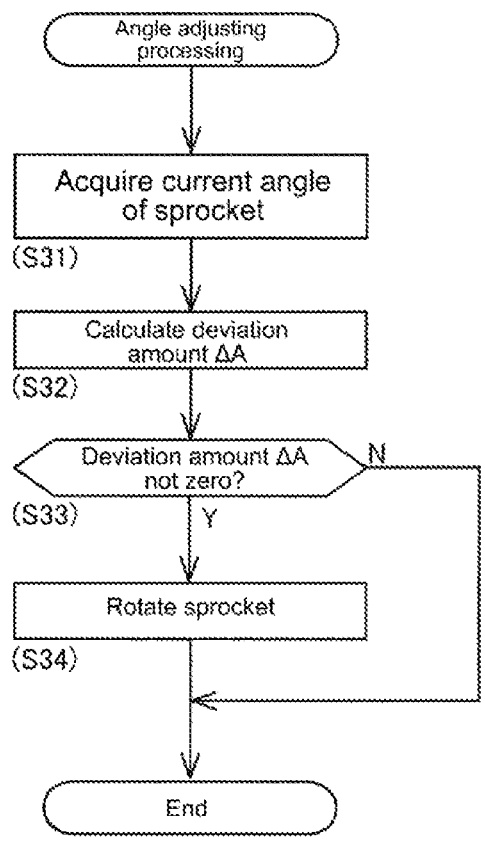
FIG. 7 is a flowchart illustrating angle adjusting processing for rectifying deviation of the sprocket when movement occurred with the tape feeder in the on state.

Specifically, as shown in FIG. 7, angle adjusting section 62 of control device 60 acquires the current angle of sprocket 31 detected by angle sensor 50 (S31). Next, angle adjusting section 62 reads the final angle stored in memory section 61, and calculates the difference from current angle as the deviation amount ΔA (S32). Subsequently, when the deviation amount ΔA is not 0 (S33: yes), angle adjusting section 62 recognizes that deviation of tape -0 has occurred with feeder 20 in the off state.

Then, angle adjusting section 62 rotates sprocket 31 from current angle acquired in S31 to the target angle to convey tape -0 to the predetermined position. In the present embodiment, angle adjusting section 62 sets the read final angle as target angle and rotates sprocket 31 by deviation amount ΔA to perform angle adjustment (S35). That is, when the tape -0 is shifted backwards (refer to the middle part of FIG. 6, ΔA<0), angle adjusting section 62 rotates sprocket 31 forward so as to move the tape -0 forward.

Further, when the tape -0 is shifted forwards (refer to the lower part of FIG. 6, ΔA>0), angle adjusting section 62 rotates sprocket 31 in reverse so as to move the tape -0 backwards. As a result, the tape -0 is returned to the standby position (see the upper part of FIG. 6) along with the transition of feeder 20 to the on state. On the other hand, when deviation amount ΔA calculated in S32 is 0 (S33: no), angle adjusting section 62 omits the angle adjustment (S35) of sprocket 31, and ends adjustment processing.

According to feeder 20 described above, when feeder 20 transitions from the off state to the on state, sprocket 31 is rotated to target angle corresponding to final angle (in this embodiment, target angle is set equal to final angle) (S35). As a result, even if sprocket 31 rotates to some extent in the off state, deviation amount ΔA is absorbed by sprocket 31 being rotated to target angle. Thus, the feeder 20 can reliably supply components at supply section 211. As a result, the feeder 20 can suppress the occurrence of electronic component supply errors while in the on state while allowing the sprocket to rotate to some extent in the off state.

2. Alternative Embodiments

2J1. Target Angle

In an embodiment above, control device 60 is configured to adjust the angle by rotating sprocket 31 by deviation amount ΔA with final angle as target angle (S35). However, control device 60 may appropriately set target angle in adjusting processing for adjusting the angle of sprocket 31. Specifically, control device 60 may set target angle by adding a preset specified value to final angle.

Here, when feeder 20 is used in mounting processing by component mounting machine 10 or when setup using the setup jig is completed, sprocket 31 may be reversely rotated so as to retract tape -0 by a predetermined amount prior to the feeder being removed. In such cases, after detecting that feeder 20 has transitioned to the on state, control device 60 rotates the sprocket 31 forward by a specified value corresponding to the specified amount to set the tape -0 to the standby position.

Thus, in a case in which the calculated deviation amount ΔA is not 0 in angle adjusting processing of sprocket 31 (S33: yes), control device 60 sets the angle obtained by adding the specified value to the read final angle as target angle. Then, angle adjusting section 62 rotates sprocket 31 from current angle acquired in S31 to the target angle to convey tape -0 to the standby position.

Note that, returning processing for advancing tape -0 by a predetermined amount when the feeder 20 has been set as described above is performed by a set device to which the feeder 20 is removably set and that supplies power to the feeder 20, or the returning processing is omitted. Specifically, with the set device given as an example in an embodiment, when the set device is component mounting machine 10 or the setup jig, returning processing is performed. On the other hand, when the set device is an inspection machine of feeder 20, for example, a master tape for inspection is loaded, and therefore some or all of the returning processing is omitted so as not to convey the master tape.

Thus, control device 60 switches the prescribed value to be added to final angle according to the type of the set device (for example, when the set device is an inspection device, the specified value is set to 0). According to such a configuration, when feeder 20 is set in the set device, control device 60 can appropriately set target angle according to the type of the set device acquired via communication. Therefore, the angle of sprocket 31 can be adjusted so as to rotate to target angle according to the set device while reliably absorbing the deviation amount generated in the off state.

Further, control device 60 may set a different target angle according to the rotation direction of sprocket 31 from final angle to current angle with feeder 20 in the off state. For example, when the rotation direction of sprocket 31 from final angle to current angle is the direction in which tape -0 advances (see the lower part of FIG. 6), control device 60 sets the angle of sprocket 31 at which a cavity -1 among the multiple cavities -1 that has not passed by supply section 211 is positioned at supply section 211 to target angle.

Here, if the deviation amount occurs such that the tape -0 moves forward with feeder 20 in the off state, since cover tape -3 is peeled off in front of supply section 211, there is a possibility that the component will come out of the cavity -1 that has passed by supply section 211. In such a case, for example, if the final angle is set to the target angle and sprocket 31 is reversed to adjust the angle, the empty cavity -1 may be positioned at supply section 211 in a subsequent feeding operation.

Therefore, when tape -0 deviates so as to move forward with feeder 20 in the off state, control device 60 sets the angle of sprocket 31 at which a cavity -1 among the multiple cavities -1 that has not passed by supply section 211 is positioned at supply section 211 to target angle, without performing return angle adjusting. As a result, an empty cavity -1 can be prevented from being positioned at supply section 211, thereby preventing a decrease in productivity.

On the other hand, when the rotation direction of sprocket 31 from final angle to current angle is the direction in which the carrier tape is reversed (refer to the middle part of FIG. 6), control device 60 sets target angle to final angle, as illustrated in the embodiment. In this manner, by setting differing target angles depending on the rotation directions of sprocket 31 with feeder 20 in the off state, it is possible to reliably suppress the occurrence of component supply errors in the on state.

REFERENCE SIGNS LIST

10: electronic component mounting machine;
20: tape feeder;
21: feeder main body;
211: supply section;
30: driving device;

31: sprocket;
311: engagement protrusion;
32: stepping motor;
50: angle sensor;
60: control device;
61: memory section;
62: angle adjusting section;
-0: carrier tape;
-1: cavity;
-2: engagement hole;
90: circuit board;
T1, T2: interval;
ΔA: deviation

The invention claimed is:

1. A tape feeder configured to convey carrier tape containing electronic components and supply an electronic component to an electronic component mounting machine, the tape feeder comprising:
    a feeder main body;
    a sprocket rotatably provided on the feeder main body and arranged with multiple engagement protrusions configured to engage with multiple engagement holes formed on the carrier tape;
    an angle sensor configured to detect
        a final angle of the sprocket at a point in time at which interruption of power supply to the tape feeder is detected, and
        a current angle of the sprocket at a point in time at which resumption of power supply to the tape feeder is detected; and
    a control device configured to, when resumption of power supply to the tape feeder is detected,
        calculate a difference between the final angle and the current angle as a deviation amount,
        set a target angle of the sprocket based on the deviation amount, the target angle being an angle of the sprocket with respect to the feeder main body when the carrier tape is in a predetermined position, and
        perform control to rotate the sprocket from the current angle to the target angle so as to convey the carrier tape to the predetermined position.

2. The tape feeder according to claim 1, wherein the control device is configured to perform control to rotate the sprocket by the deviation amount using the final angle as the target angle.

3. The tape feeder according to claim 1, wherein
    the feeder main body includes a supply section configured to supply the electronic components to the electronic component mounting machine,
    the carrier tape includes multiple cavities for storing the electronic components formed at a specified interval in a conveyance direction, and
    the target angle is an angle of the sprocket for which a cavity, which is on a leading end side of the carrier tape to a cavity that is a first cavity from the leading end side of the carrier tape that houses the electronic component, is positioned at the supply section.

4. The tape feeder according to claim 1, wherein the control device is configured to perform control to rotate the sprocket by a sum of the deviation amount and a specified value using a sum of the final angle and the specified value as the target angle.

5. The tape feeder according to claim 4, wherein
    the specified value is set according to a type of a set device, and
    the set device is removably set to the tape feeder and configured to supply power to the tape feeder.

6. The tape feeder according to claim 5, wherein the type of the set device includes the electronic component mounting machine, a setup jig, or an inspection device.

7. The tape feeder according to claim 1, wherein the control device is configured to set the target angle differently depending on the rotational direction of the sprocket from the final angle to the current angle.

8. The tape feeder according to claim 7, wherein
    the feeder main body includes a supply section configured to supply the electronic components to the electronic component mounting machine,
    the carrier tape includes multiple cavities for storing the electronic components formed at a specified interval in a conveyance direction, and
    the control device is configured to, when a rotation direction of the sprocket from the final angle to the current angle is a direction in which the carrier tape proceeds, set an angle of the sprocket for which, from among the multiple cavities, a cavity that has not passed the supply section is positioned at the supply section as the target angle.

9. The tape feeder according to claim 7, wherein the control device is configured to, in a case in which the rotation direction of the sprocket from the final angle to the current angle is a direction that retracts the carrier tape, set the target angle to the final angle.

* * * * *